(12) United States Patent
Ma

(10) Patent No.: US 6,791,847 B2
(45) Date of Patent: Sep. 14, 2004

(54) RETENTION MODULE FOR HEAT SINK

(75) Inventor: Hao-Yun Ma, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/364,235

(22) Filed: Feb. 10, 2003

(65) Prior Publication Data

US 2003/0231479 A1 Dec. 18, 2003

(30) Foreign Application Priority Data

Jun. 13, 2002 (TW) ...................................... 91208812 U

(51) Int. Cl.[7] .............................................. H05K 3/00
(52) U.S. Cl. ...................... 361/816; 361/818; 174/35 R
(58) Field of Search ................. 361/816, 818, 361/695–697, 701–703, 707, 709–710; 174/35 R, 51

(56) References Cited

U.S. PATENT DOCUMENTS

| | | | | |
|---|---|---|---|---|
| 3,904,262 A | * | 9/1975 | Cutchaw ...................... 439/71 |
| 5,495,392 A | * | 2/1996 | Shen ........................... 361/697 |
| 6,055,159 A | * | 4/2000 | Sun .............................. 361/704 |
| 6,064,574 A | * | 5/2000 | Yu et al. ...................... 361/704 |
| 6,362,962 B1 | * | 3/2002 | Lee et al. .................... 361/704 |
| 6,430,049 B1 | * | 8/2002 | Lai et al. ..................... 361/704 |
| 6,549,412 B1 | * | 4/2003 | Ma ............................. 361/704 |
| 6,570,763 B1 | * | 5/2003 | McHugh et al. ............ 361/704 |

* cited by examiner

Primary Examiner—David Martin
Assistant Examiner—Thanh S. Phan
(74) Attorney, Agent, or Firm—Wei Te Chung

(57) ABSTRACT

A retention module (30) of the present invention is fastened to a motherboard (50), and surrounds a land grid array (LGA) central processing unit (CPU) (52) which is engaged on an LGA socket (54) that is mounted on the motherboard. The heat sink includes a base (12), and a plurality of fins (14) extending upwardly from the base. A notch (16) is defined in each of four sides of the base. The retention module includes a rectangular bottom plate (32). A side plate (36) extends upwardly from each of four sides of the bottom plate. A locating block (40) is formed on an inside of each side plate. The locating blocks are fittingly received in the notches of the base, thereby preventing the heat sink from sliding in horizontal directions. Thus the heat sink is prevented from disturbing mechanical and electrical engagement of the CPU with the socket.

10 Claims, 4 Drawing Sheets

RETENTION MODULE FOR HEAT SINK

BACKGROUND OF THE INVENTION

1. Field of the Invention

The present invention relates to retention modules for heat sinks, and particularly to a retention module which can prevent a heat sink from disturbing engagement of a land grid array (LGA) central processing unit (CPU) with an LGA socket.

2. Related Art

A conventional heat sink fixing module comprises two clips and a fixing base. The fixing base comprises a frame. An opening is defined in a center portion of the frame for receiving a CPU therein. Four side plates extend from four sides of the frame respectively. Two spaced locking holes are defined in each of two opposite of the side plates. The clips engaging with the locking holes thereby fastening the heat sink to the fixing base. The heat sink fixing module retains the heat sink in vertical directions, but it does not necessarily prevent the heat sink from sliding in horizontal directions. This is particularly a problem when the heat sink fixing module is used with an LGA CPU. Contact pads of the LGA CPU press on resilient contact arches of a corresponding LGA socket. The heat sink is prone to slide in horizontal directions, dragging the LGA CPU with it. The contact pads of the LGA CPU are displaced relative to the contact arches of the socket. This can result in faulty or even no mechanical and electrical engagement between the contact pads and the contact arches. The assembly is liable to function improperly or not at all.

SUMMARY OF THE INVENTION

Accordingly, an object of the present invention is to provide a retention module which can prevent a heat sink from disturbing engagement of an LGA CPU with an LGA socket.

To achieve the above-mentioned object, a retention module in accordance with a preferred embodiment of the present invention is for preventing a heat sink from disturbing engagement of an LGA CPU with an LGA socket. The CPU is engaged on the socket, the socket that is mounted on a motherboard. The retention module is fastened to the motherboard by a plurality of screws and a fixing frame, such that the retention module surrounds the socket. The heat sink comprises a base and a plurality of fins extending upwardly from the base. A notch is defined in each of four sides of the base. The retention module includes a rectangular bottom plate. An opening is defined in a center of the bottom plate, the opening receiving the socket and CPU therein. A side plate extends upwardly from each of four sides of the bottom plate. A locating block is formed at an inside of each side plate. The locating blocks are fittingly received in the notches of the base, thereby preventing the heat sink from sliding in horizontal directions. Thus the heat sink is prevented from disturbing mechanical and electrical engagement of the CPU with the socket.

Other objects, advantages and novel features of the present invention will be drawn from the following detailed description of preferred embodiments of the present invention with attached drawings, in which:

DESCRIPTION OF THE PREFERRED EMBODIMENTS

Figure 1:
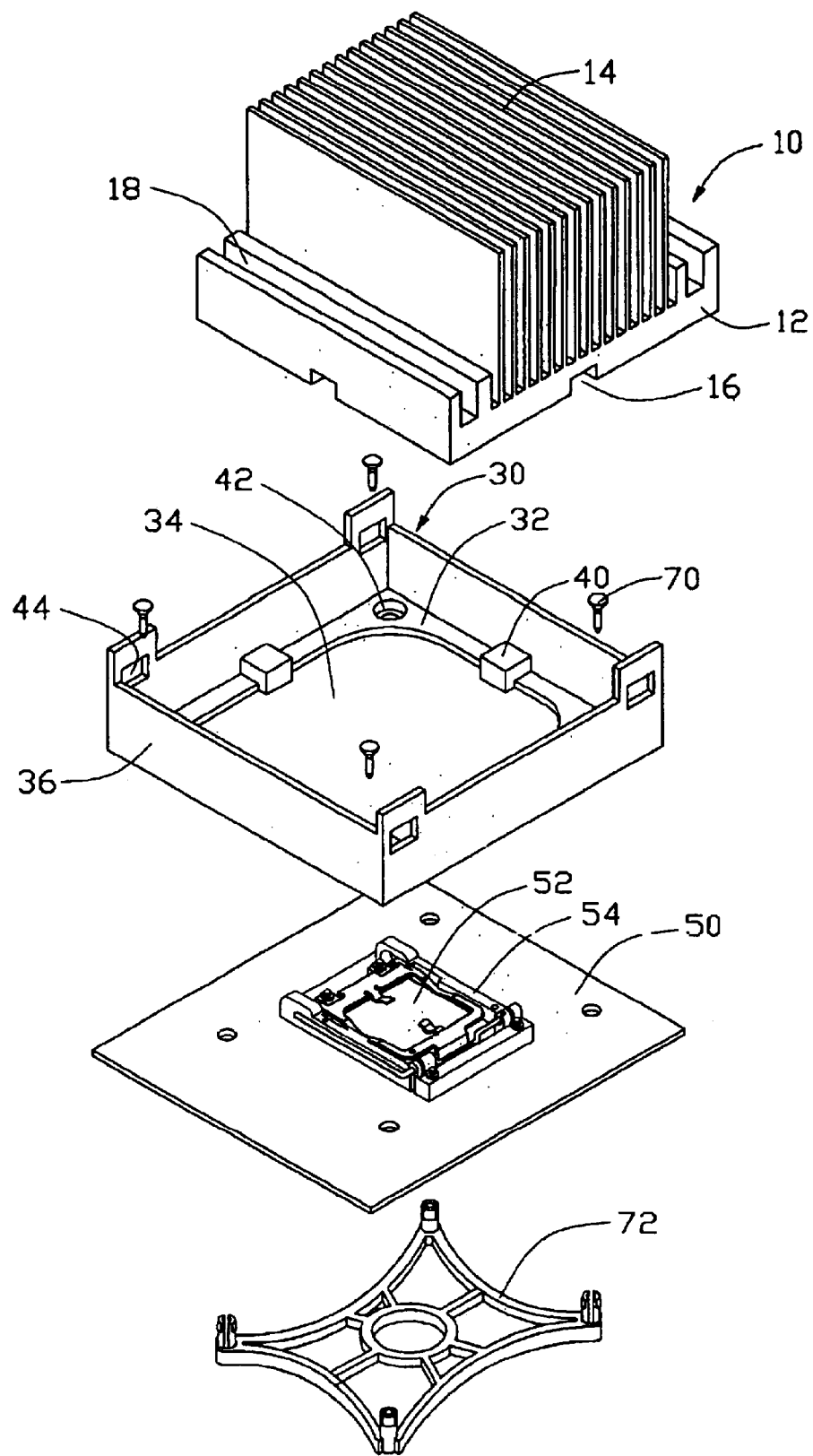
FIG. 1 is an exploded, isometric view of a retention module in accordance with a preferred embodiment of the present invention, together with a heat sink, a motherboard and a fixing frame.

Referring to FIG. 1, a retention module 30 in accordance with the preferred embodiment of the present invention is for preventing a heat sink 10 from disturbing engagement of an LGA CPU 52 with an LGA socket 54. The CPU 52 is engaged on the socket 54 that is mounted on a motherboard 10. The retention module 30 is fastened to the motherboard 50 by a plurality of screws 70 and a fixing frame 72, such that the retention module 30 surrounds the socket 54.

The heat sink 10 comprises a rectangular base 12, and a plurality of parallel fins 14 extending upwardly from the base 12. A pair of parallel locking grooves 18 is defined in opposite sides of the base 12 respectively, at respective opposite sides of and parallel to the fins 14. A pair of clips (not shown) is received in the locking grooves 18. The clips engage with the retention module 30 and thereby secure the heat sink 10 in vertical directions. Four notches 16 are defined in bottoms of four sides of the base 12 respectively. Each notch 16 is parallelepiped-shaped.

The retention module 30 comprises a rectangular bottom plate 32. An opening 34 is defined in a center of the bottom plate 32, for receiving the socket 54 and CPU 52 therein. Four through holes 42 are defined in four corners of the bottom plate 32, for insertion of four screws 70 therein. Four side plates 36 extend perpendicularly upwardly from four sides of the bottom plate 32 respectively. Two spaced locking holes 44 are defined in each of two opposite of the side plates 36. The locking holes 44 are for engagingly receiving the clips. Four locating blocks 40 are formed at the four sides of the bottom plate 32 at insides of the respective side plates 36, the locating blocks 40 corresponding to the notches 16 of the heat sink 10. Each locating block 40 is parallelepiped-shaped.

Figure 2:
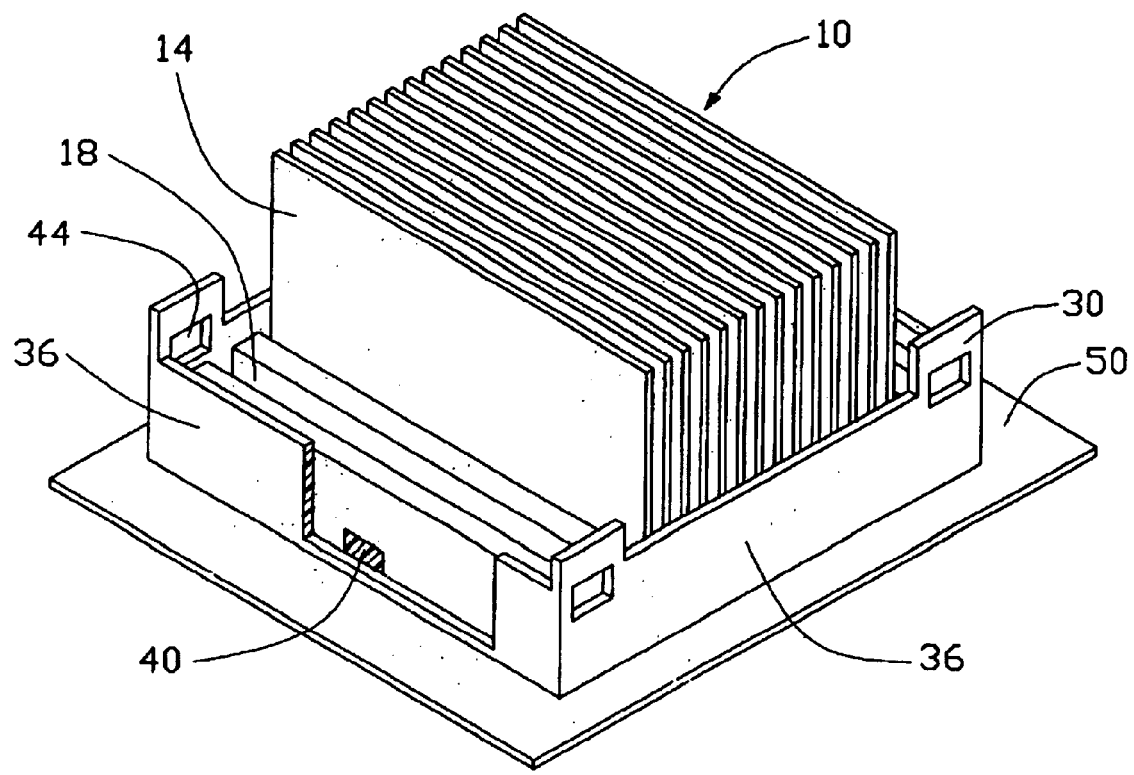
FIG. 2 is an assembled view of FIG. 1, with part of the retention module cut away for better illustration.

Referring to FIG. 2, in assembly, the fixing frame 72 is attached to an underside of the motherboard 50. The screws 70 are extended through the through holes 42 of the retention module 30 and engaged with the fixing frame 72, thereby fastening the retention module 30 to the motherboard 50. A layer of heat conductive material such as paste is applied to a center portion of a bottom of the base 12 of the heat sink 50. The heat sink 10 is placed in the retention module 30 with means (not shown) on the center portion of the bottom of the base 12 abutting on the CPU 52 for heat transfer. The clips are attached to the heat sink 10 and the retention module 30, thereby securing the heat sink 10 in vertical directions. The locating blocks 40 of the retention module 30 are fittingly received in the notches 16 of the heat sink 10, thereby preventing the heat sink 10 from sliding in horizontal directions. Thus the heat sink 10 is prevented from disturbing mechanical and electrical engagement of the CPU 52 with the socket 54.

Figure 3:
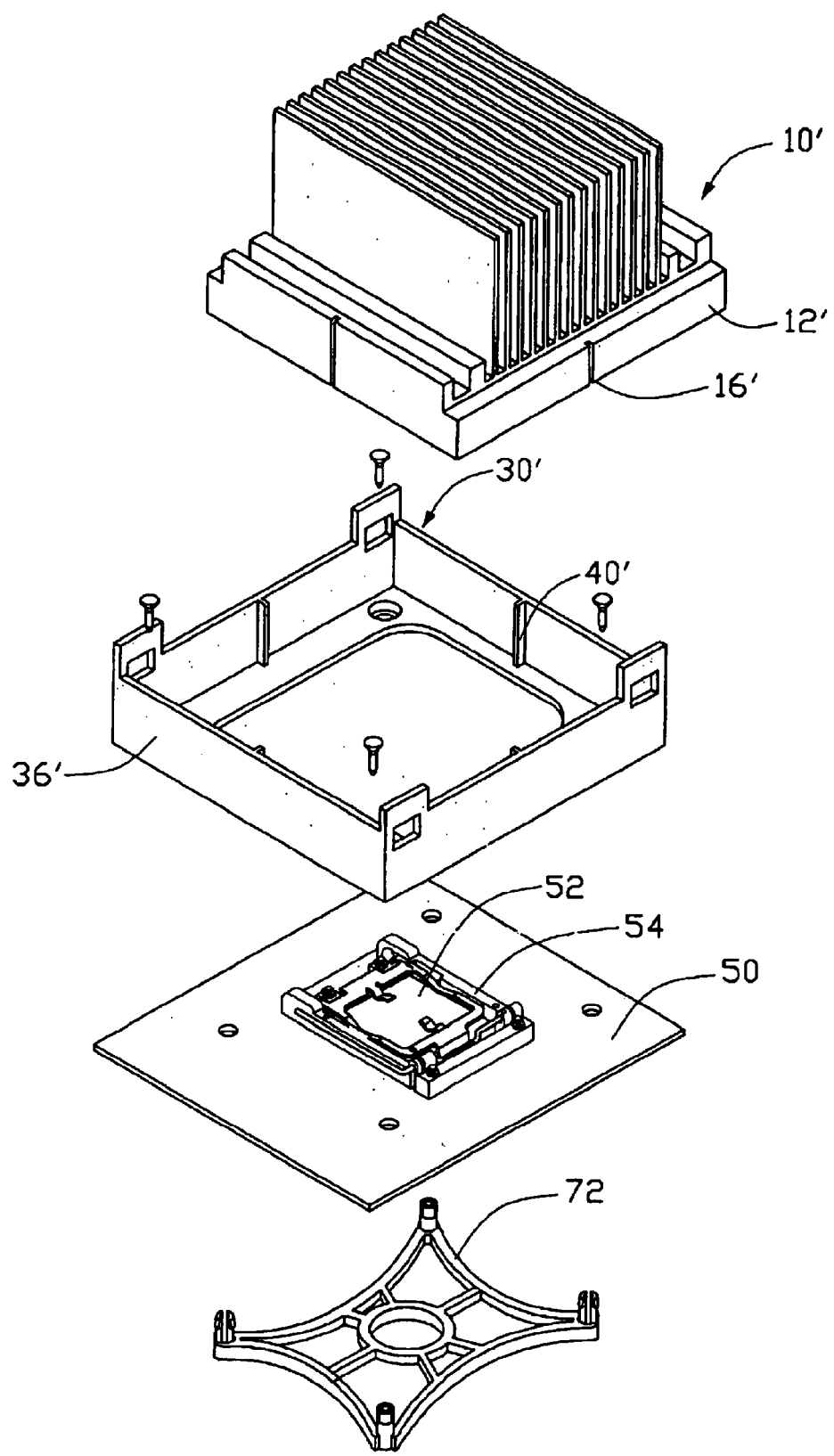
FIG. 3 is a exploded, isometric view of a retention module in accordance with an alternative embodiment of the present invention.
Figure 4:
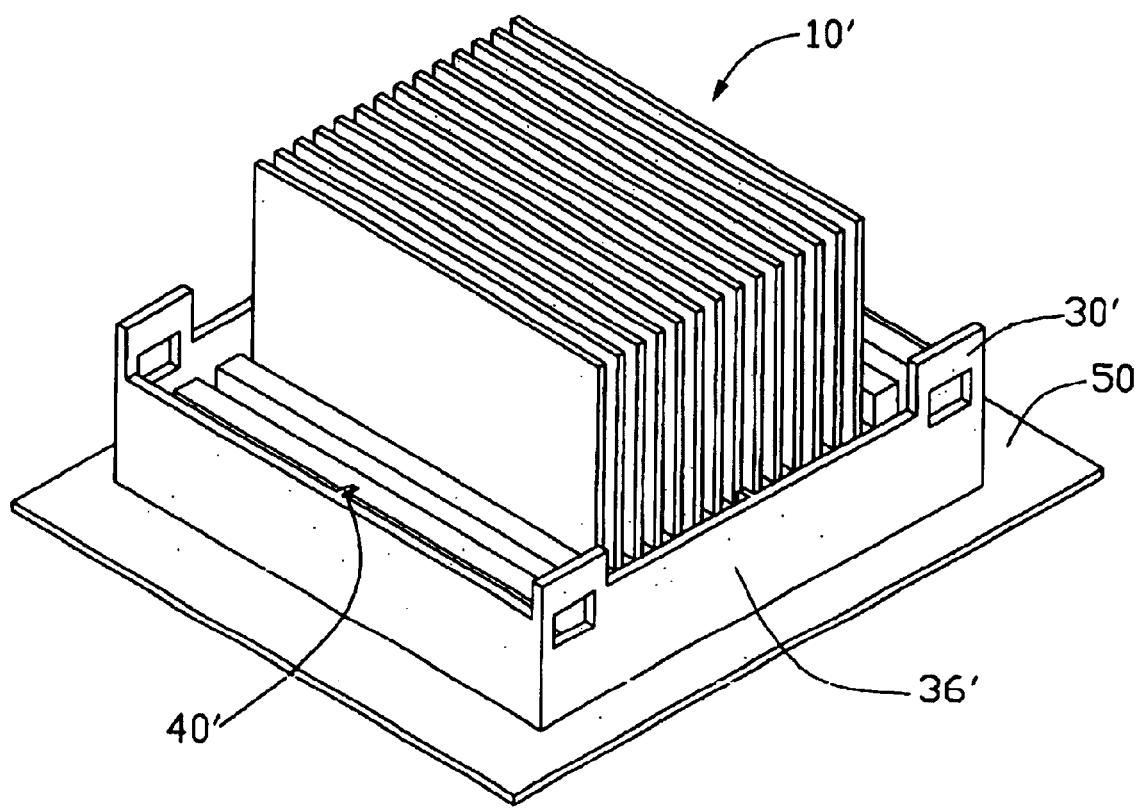
FIG. 4 is an assembled view of FIG. 3.

FIGS. 3 and 4 show a retention module 30' in accordance with the alternative embodiment of the present invention. Four slots 16' are defined in four sides respectively of a base 12' of a heat sink 10', in lieu of the notches 16 of the base 12 of the heat sink 10 of the preferred embodiment. Four protruding ribs 40' are formed at inner faces of four side plates 36' respectively of a retention module 30', in lieu of the locating blocks 16 of the retention module 30 of the preferred embodiment. The protruding ribs 40' are fittingly engaged in the slots 16' of the heat sink 10'.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A retention module adapted for retaining a heat sink on an electronic package that is mounted to a circuit board, the retention module comprising:

a bottom plate adapted to be secured to the circuit board, the bottom plate defining a through opening for extension of the electronic package therethrough; and a plurality of side plates extending from the bottom plate, wherein at least two locating members protrude inwardly from at two non-parallel sides of the retention module respectively, the at least two locating members being adapted to fittingly engage with at least two locating portions of the heat sink for preventing the heat sink from sliding relative to the electronic package wherein the at least two locating members comprises at least two protrusions formed at inner faces of at least two of the side plates respectively, the protrusions being adapted to fittingly engage in at least two corresponding slots of the locating portions of the heat sink.

2. The retention module as described in claim 1, wherein the at least two locating members comprise at least two locating blocks arranged at the bottom plate, the at least two locating blocks being adapted to fittingly engage in at least two corresponding notches of the locating portions of the heat sink.

3. The retention module as described in claim 1, wherein the side plates extend perpendicularly from the bottom plate.

4. The retention module as described in claim 1, wherein four through holes are defined in four corners of the bottom plate, for extension of fasteners therethrough to attach the retention module to the circuit board.

5. The retention module as described in claim 1, wherein the electronic package is a land grid array (LGA) central processing unit (CPU).

6. A heat dissipation assembly comprising:

a circuit board;

an electronic package attached on the circuit board;

a retention module attached on a top side of the circuit board, the retention module comprising a bottom plate and a plurality of side plates extending from the bottom plate, the bottom plate defining an opening; and a heat sink located in the retention module and retained thereto in vertical directions, the heat sink comprising a base contact with the electronic package which extends through the opening of the bottom plate from a lower side of the bottom plate, wherein a plurality of first locating means is provided at insides of the retention module, and a plurality of second locating means is provided at the base of the heat sink, the first locating means fittingly engaging with the second locating means to restrict movement of he heat sink horizontally;

wherein the first locating means comprise protrusions formed at inner faces of the side plates, and the second locating means comprise slots defined in sides of the base of the heat sink, the protrusions fittingly engaging in the slots.

7. The heat dissipation assembly as described in claim 6, wherein the first locating means comprise locating blocks formed at the bottom plate, and the second locating means comprise notches defined in sides of the base of the heat sink, the locating blocks fittingly engaging in the notches.

8. The heat dissipation assembly as described in claim 6, wherein the side plates extend perpendicularly from the bottom plate.

9. The heat dissipation assembly as described in claim 6, wherein four through holes are defined in four corners of the bottom plate, and four fasteners are extended through the through holes to attach the retention module to the circuit board.

10. The heat dissipation assembly as described in claim 6, wherein the electronic package is a land grid array (LGA) central processing unit (CPU).

* * * * *